United States Patent
Chou et al.

(10) Patent No.: US 9,224,464 B2
(45) Date of Patent: Dec. 29, 2015

(54) MEMORY CIRCUIT AND RELATED METHOD

(71) Applicant: Taiwan Semiconductor Manufacturing Company, Ltd., Hsin-Chu (TW)

(72) Inventors: Chung-Cheng Chou, Hsin-Chu (TW); Po-Hao Lee, Hsin-Chu (TW); Jonathan Tehan Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/176,820

(22) Filed: Feb. 10, 2014

(65) Prior Publication Data
US 2015/0228333 A1  Aug. 13, 2015

(51) Int. Cl.
*G11C 7/12* (2006.01)
*G11C 13/00* (2006.01)

(52) U.S. Cl.
CPC ............ *G11C 13/004* (2013.01); *G11C 7/12* (2013.01); *G11C 2013/0054* (2013.01)

(58) Field of Classification Search
CPC .............................. G11C 7/12; G11C 13/0069
USPC .................................. 365/148, 158, 205
See application file for complete search history.

(56) References Cited

U.S. PATENT DOCUMENTS

| | | | |
|---|---|---|---|
| 6,525,896 B2 * | 2/2003 | Chung et al. | 360/68 |
| 7,663,952 B2 * | 2/2010 | Tomishima | 365/203 |
| 7,825,727 B2 * | 11/2010 | Shimatani | 330/253 |
| 7,826,284 B2 * | 11/2010 | La Placa et al. | 365/196 |
| 8,537,595 B2 * | 9/2013 | Toda | 365/148 |
| 8,576,608 B2 * | 11/2013 | Tsushima et al. | 365/148 |
| 8,614,921 B2 * | 12/2013 | Watanabe | 365/185.2 |
| 8,654,600 B1 * | 2/2014 | Pollachek | 365/207 |
| 8,830,733 B2 * | 9/2014 | El Baraji et al. | 365/158 |
| 8,837,210 B2 * | 9/2014 | Jefremow et al. | 365/158 |

* cited by examiner

*Primary Examiner* — Michael Tran
(74) *Attorney, Agent, or Firm* — Slater & Matsil, L.L.P.

(57) ABSTRACT

A device includes a memory bit cell, a first current source, and a current comparator electrically connected to the memory bit cell and the first current source. A first transistor has a first terminal electrically connected to a first voltage supply node, a control terminal electrically connected to a controller, and a second terminal electrically connected to the memory bit cell and the current comparator. A sense amplifier is electrically connected to the current comparator and a reference current generator.

20 Claims, 6 Drawing Sheets

MEMORY CIRCUIT AND RELATED METHOD

BACKGROUND

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node (e.g., shrinking the process node towards the sub-20 nm node).

Memory circuits are facing tighter requirements for power, performance, and area. Nonvolatile memory is a form of memory circuit that retains its programmed or erased state regardless of whether power is applied to the memory circuit. Types of nonvolatile memory include: resistive random-access memory (RRAM or ReRAM), magnetoresistive random-access memory (MRAM), phase-change random-access memory (PCRAM), and conductive-bridging random-access memory (CBRAM), among others. An RRAM bit cell is programmed by forming a filament(s) or conductive path in a dielectric medium, and erased by breaking the filament(s). The programmed (or "set") RRAM bit cell is able to conduct much higher current than the erased (or "reset") RRAM bit cell. The relative current level of the RRAM bit cell is read by a sense amplifier to generate a binary bit corresponding to the state (set or reset) of the RRAM bit cell.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely sense amplifier circuits and related methods. Other embodiments may also be applied, however, to other types of sensing or amplifying circuits.

Throughout the various figures and discussion, like reference numbers refer to like objects or components. Also, although singular components may be depicted throughout some of the figures, this is for simplicity of illustration and ease of discussion. A person having ordinary skill in the art will readily appreciate that such discussion and depiction can be and usually is applicable for many components within a structure.

In the following disclosure, a novel memory circuit and method are introduced. The memory circuit uses a pre-charge circuit and a latch-based sense amplifier to achieve consistent performance across various process corners.

Figure 1:
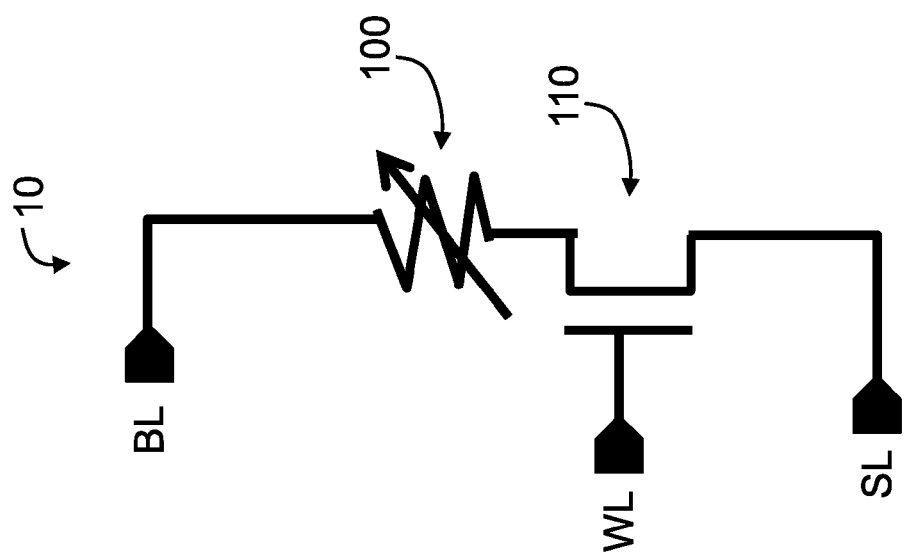
FIG. 1 is a diagram showing a bit cell of a memory circuit in accordance with various embodiments of the present disclosure.

FIG. 1 is a diagram showing a bit cell 10 of a memory circuit in accordance with various embodiments of the present disclosure. In some embodiments, the bit cell 10 includes a selecting device 110 and a memory device 100. In some embodiments, the selecting device 110 is a transistor having a gate electrode electrically connected to a word line of a memory array including the bit cell 10. In some embodiments, the memory device 100 is an RRAM, MRAM, PCRAM, or CBRAM device, or the like. A first terminal of the memory device 100 is electrically connected to a bit line of the memory array, and a second terminal of the memory device 100 is electrically connected to a source or drain electrode of the selecting device 110. The drain or source electrode of the selecting device 110 is electrically connected to a source line of the memory array.

Figure 2:
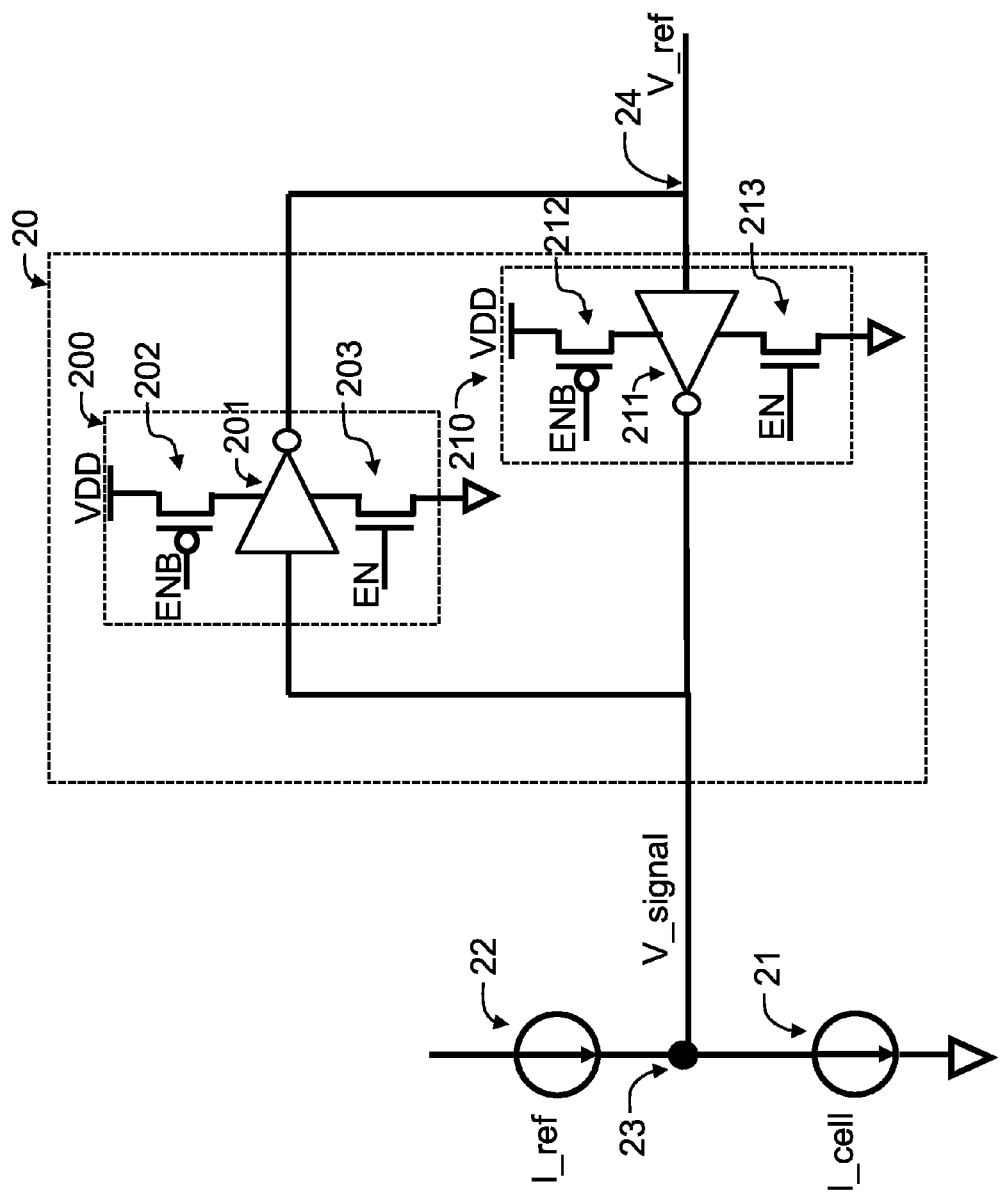
FIG. 2 is a diagram showing a memory circuit in accordance with various embodiments of the present disclosure.

FIG. 2 is a diagram showing a memory circuit in accordance with various embodiments of the present disclosure. The memory circuit includes a bit cell 21 (represented as a current source in the Figure), a reference current source 22, and a sense amplifier 20. Signal voltage V_signal on a node 23 is determined by relative strength of cell current I_cell generated by the bit cell 21 and reference current I_ref generated by the reference current source 22. The sense amplifier 20 compares the signal voltage V_signal with a reference voltage V_ref to determine state (set or reset) of the bit cell 21.

The sense amplifier 20 is a latch-based amplifier that includes two inverter units 200, 210. The first inverter unit 200 includes a first inverting circuit 201 (e.g., a complementary metal-oxide-semiconductor, or "CMOS," inverter), and two enabling devices 202, 203. In some embodiments, the first enabling device 202 is a P-type transistor having a source electrode electrically connected to a first voltage supply node that carries a first voltage VDD (e.g., 1 Volt) when the memory circuit is powered on. In some embodiments, the second enabling device 203 is an N-type transistor having a source electrode electrically connected to a second voltage supply node carrying a second voltage (e.g., ground). When an enable signal EN is at a high voltage (e.g., between 0.5 and 1 Volts), the second transistor 203 is on. When an enable bar signal ENB is at a low voltage (e.g., between 0 and 0.5 Volts), the first transistor 202 is on. When the first and second transistors 202, 203 are on, the first inverting circuit 201 receives electrical power, and is able to perform electrical functions.

The second inverter unit 210 includes a second inverting circuit 211 (e.g., a CMOS inverter), and two enabling devices 212, 213. In some embodiments, the first enabling device 212 is a P-type transistor having a source electrode electrically connected to a first voltage supply node that carries a first voltage VDD (e.g., 1 Volt) when the memory circuit is powered on. In some embodiments, the second enabling device 213 is an N-type transistor having a source electrode electrically connected to a second voltage supply node carrying a second voltage (e.g., ground). When an enable signal EN is at a high voltage (e.g., between 0.5 and 1 Volts), the second transistor 213 is on. When an enable bar signal ENB is at a low voltage (e.g., between 0 and 0.5 Volts), the first transistor 212 is on. When the first and second transistors 212, 213 are on, the second inverting circuit 211 receives electrical power, and is able to perform electrical functions.

An input terminal of the first inverting circuit 201 is electrically connected to an output terminal of the second inverting circuit 211 (at the node 23). An output terminal of the first inverting circuit 201 is electrically connected to an input terminal of the second inverting circuit 211 (at a node 24). If the signal voltage V_signal is lower than the reference voltage, the sense amplifier 20 increases voltage at the node 24 to about the first voltage VDD, and decreases voltage at the node 23 to about the second voltage (e.g., ground). If the signal voltage V_signal is higher than the reference voltage, the sense amplifier 20 decreases the voltage at the node 24 to about the second voltage, and increases the voltage at the node 23 to about the first voltage VDD.

Figure 3:
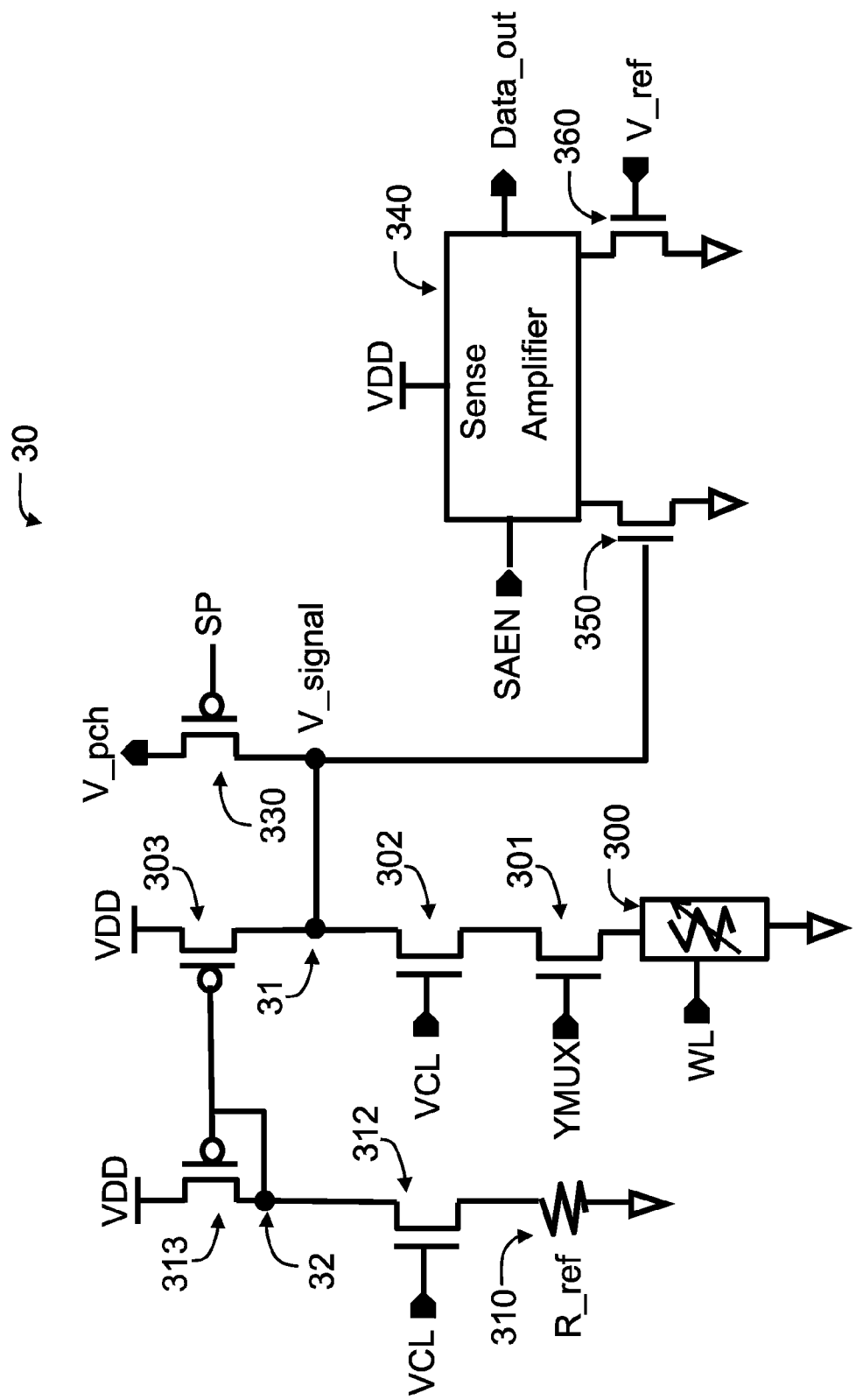
FIG. 3 is a diagram showing a memory circuit in accordance with various embodiments of the present disclosure.

FIG. 3 is a diagram showing a memory circuit 30 in accordance with various embodiments of the present disclosure. The memory circuit 30 is similar to the memory circuit of FIG. 2 in some aspects. A reference current source of the memory circuit 30 includes a resistive device 310, clamping device 312, and a transistor 313. Other reference current source architectures are also contemplated herein. The resistive device 310, which is a polysilicon resistor in some embodiments, has a first terminal electrically connected to a source electrode of the clamping device 312, and a second terminal electrically connected to a second voltage supply node (e.g., ground). In some embodiments, the clamping device 312 is an NMOS transistor. A gate electrode of the clamping device 312 is electrically connected to a clamping voltage source. A drain electrode of the clamping device 312 is electrically connected to a drain electrode of the transistor 313 (node 32). In some embodiments, the transistor 313 is a PMOS transistor. A gate electrode of the transistor 313 is electrically connected to the drain electrode of the transistor 313. A source electrode of the transistor 313 is electrically connected to a first voltage supply node. The first voltage supply node supplies a first voltage VDD.

A transistor 303 mirrors drain current of the transistor 313. A source electrode of the transistor 303 is electrically connected to the first voltage supply node. A gate electrode of the transistor 303 is electrically connected to the gate electrode of the transistor 313 (node 32). A drain electrode of the transistor 303 is electrically connected to a node 31 that carries a signal voltage V_signal. A clamp transistor 302, a select transistor 301, and a memory bit cell 300 form a current path to the second voltage supply node from the node 31. A drain electrode of the clamp transistor 302 is electrically connected to the node 31 (the drain electrode of the transistor 303). A gate electrode of the clamp transistor 302 is electrically connected to a clamping voltage source. In some embodiments, the same clamping voltage source is electrically connected to the gate electrode of the clamping transistors 302, 312. A source electrode of the clamping transistor 302 is electrically connected to a drain electrode of the select transistor 301. A gate electrode of the select transistor 301 is electrically connected to a column driver that provides a select signal YMUX. A source electrode of the select transistor 301 is electrically connected to a first terminal of the memory bit cell 300. In some embodiments, the memory bit cell 300 is an RRAM, MRAM, PCRAM, or CBRAM bit cell, or the like. The memory bit cell 300 has a select terminal electrically connected to a word line driver that supplies a word line signal WL. A second terminal of the memory bit cell 300 is electrically connected to the second voltage supply node (e.g., ground).

The signal voltage V_signal is determined by at least three factors, including level of precharge voltage V_pch, drain current of the transistor 303, and current of the memory bit cell 300. The transistor 330, when on, charges the signal voltage V_signal to substantially the precharge voltage V_pch. In some embodiments, the transistor 330 is a P-type transistor, such as a PMOS transistor. A source electrode of the transistor 330 is electrically connected to a precharge voltage supply that provides the precharge voltage V_pch (e.g., VDD). A gate electrode of the transistor 330 is electrically connected to a controlling circuit that generates a precharge signal SP to control on/off state of the transistor 330. A drain electrode of the transistor 330 is electrically connected to the node 31.

A sense amplifier 340 receives a signal input and a reference input, as well as a sense amplifier enable signal SAEN, and outputs a data signal Data_out based on comparison between the signal input and the reference input. A first input transistor 350 (or "current comparator 350" or "common source amplifier 350") is electrically connected to the node 31, and generates the signal input as a current signal based on the signal voltage V_signal. A drain electrode of the first input transistor 350 is electrically connected to a first input terminal of the sense amplifier 340. A gate electrode of the first input transistor 350 is electrically connected to the node 31. A source electrode of the first input transistor 350 is electrically connected to the second voltage supply node. A second input transistor 360 (or "current comparator 350" or "common source amplifier 350") is electrically connected to reference voltage supply that provides a reference voltage V_ref. The second input transistor 350 generates the reference input as a current signal based on the reference voltage V_ref. A drain electrode of the second input transistor 360 is electrically connected to a second input terminal of the sense amplifier 340. A gate electrode of the second input transistor 360 is electrically connected to reference voltage supply. A source electrode of the second input transistor 360 is electrically connected to the second voltage supply node.

Figure 4:
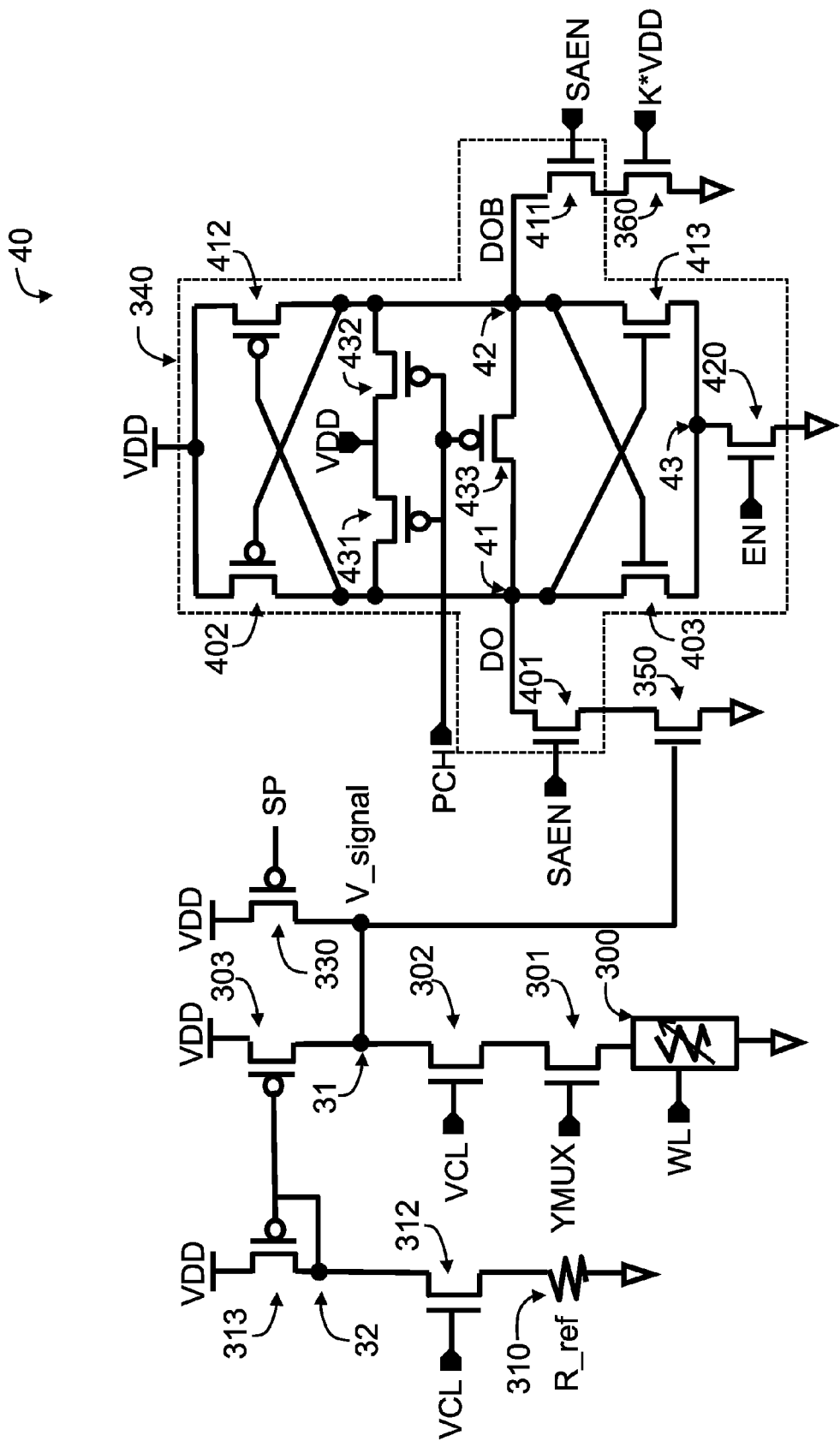
FIG. 4 is a diagram showing a memory circuit in accordance with various embodiments of the present disclosure.

FIG. 4 is a diagram showing a memory circuit 40 in accordance with various embodiments of the present disclosure. The memory circuit 40 is similar to the memory circuit 30 of FIG. 3 in some aspects, and like reference numerals refer to like elements in the Figures. In some embodiments, the sense amplifier 340 includes enabling devices 401, 411, cross-coupled inverters 402/403, 412/413, precharge devices 431-433, and controllable tail current source 420.

In some embodiments, the enabling devices 401, 411 are N-type transistors, such as NMOS transistors. A source electrode of the enabling device 401 (or "transistor 401") is electrically connected to the drain electrode of the transistor 350. A gate electrode of the transistor 401 is electrically connected to the controller, and has voltage level determined by the sense amplifier enable signal SAEN generated by the controller. A drain electrode of the transistor 401 is electrically connected to a first output node of the inverter 402, 403 (node 41).

A source electrode of the enabling device 411 (or "transistor 411") is electrically connected to the drain electrode of the transistor 360. A gate electrode of the transistor 411 is electrically connected to the controller, and has voltage level determined by the sense amplifier enable signal SAEN generated by the controller. A drain electrode of the transistor 411 is electrically connected to a second output node of the inverter 412, 413 (node 42).

The inverter 402/403 includes a transistor 402 and a transistor 403. In some embodiments, the transistor 402 is a P-type transistor (e.g., a PMOS transistor), and the transistor 403 is an N-type transistor (e.g., an NMOS transistor). A source electrode of the transistor 402 is electrically connected to the first voltage supply node. A drain electrode of the transistor 402 is electrically connected to the drain electrode of the enabling device 401. A gate electrode of the transistor 402 is electrically connected to the drain electrode of the enabling device 411 (node 42). A source electrode of the transistor 403 is electrically connected to a first terminal of the controllable tail current source 420 (or "current source 420" or "transistor 420"). A drain electrode of the transistor 403 is electrically connected to the drain electrode of the enabling device 401. A gate electrode of the transistor 403 is electrically connected to the drain electrode of the enabling device 411 (node 42).

The inverter 412/413 includes a transistor 412 and a transistor 413. In some embodiments, the transistor 412 is a P-type transistor (e.g., a PMOS transistor), and the transistor 413 is an N-type transistor (e.g., an NMOS transistor). A source electrode of the transistor 412 is electrically connected to the first voltage supply node. A drain electrode of the transistor 412 is electrically connected to the drain electrode of the enabling device 411. A gate electrode of the transistor 412 is electrically connected to the drain electrode of the enabling device 401 (node 41). A source electrode of the transistor 413 is electrically connected to a first terminal of the controllable tail current source 420. A drain electrode of the transistor 413 is electrically connected to the drain electrode of the enabling device 411. A gate electrode of the transistor 413 is electrically connected to the drain electrode of the enabling device 401 (node 41).

In some embodiments, the transistor 420 is an N-type transistor (e.g., an NMOS transistor). The drain electrode of the transistor 420 is electrically connected to the source electrode of the transistors 403, 413. A gate electrode of the transistor 420 is electrically connected to the controller. Voltage level at the gate electrode of the transistor 420 is set by an enable signal EN generated by the controller.

In some embodiments, the precharge devices 431-433 are P-type transistors (e.g., PMOS transistors). A drain electrode of the precharge device 431 (or "transistor 431") is electrically connected to the drain electrode of the transistor 401. A source electrode of the transistor 431 is electrically connected to the first voltage supply node. A drain electrode of the precharge device 432 (or "transistor 432") is electrically connected to the drain electrode of the transistor 411. A source electrode of the transistor 432 is electrically connected to the first voltage supply node. A drain electrode of the precharge device 433 (or "transistor 433") is electrically connected to the drain electrode of the transistor 401. A source electrode of the transistor 433 is electrically connected to the drain electrode of the transistor 411. Gate electrodes of the transistors 431-433 are electrically connected to the controller. A sense amplifier precharge signal PCH generated by the controller determines voltage at the gate electrodes of the transistors 431-433.

In some embodiments, the precharge signal SP, the sense amplifier precharge signal PCH, the sense amplifier enable signal SAEN, and the enable signal EN are generated by the same controller. Other embodiments in which the precharge signal SP, the sense amplifier precharge signal PCH, the sense amplifier enable signal SAEN, and the enable signal EN are generated by different controllers are also contemplated herein. In some embodiments, the reference voltage V_ref applied to the gate electrode of the transistor 360 is some fraction K of the first voltage VDD. In some embodiments, the fraction K is about 0.75. Setting the fraction K relatively high speeds up operation of the memory circuit 40. Setting the fraction K relatively low may prevent false readings by the sense amplifier 340. In some embodiments, the reference voltage V_ref is a voltage of an internal node of the memory circuit 40. In some embodiments, the internal node that provides the reference voltage V_ref to the gate electrode of the transistor 360 is the node 32 (e.g., the gate electrode of the transistor 360 is electrically connected to the node 32).

Figure 5:
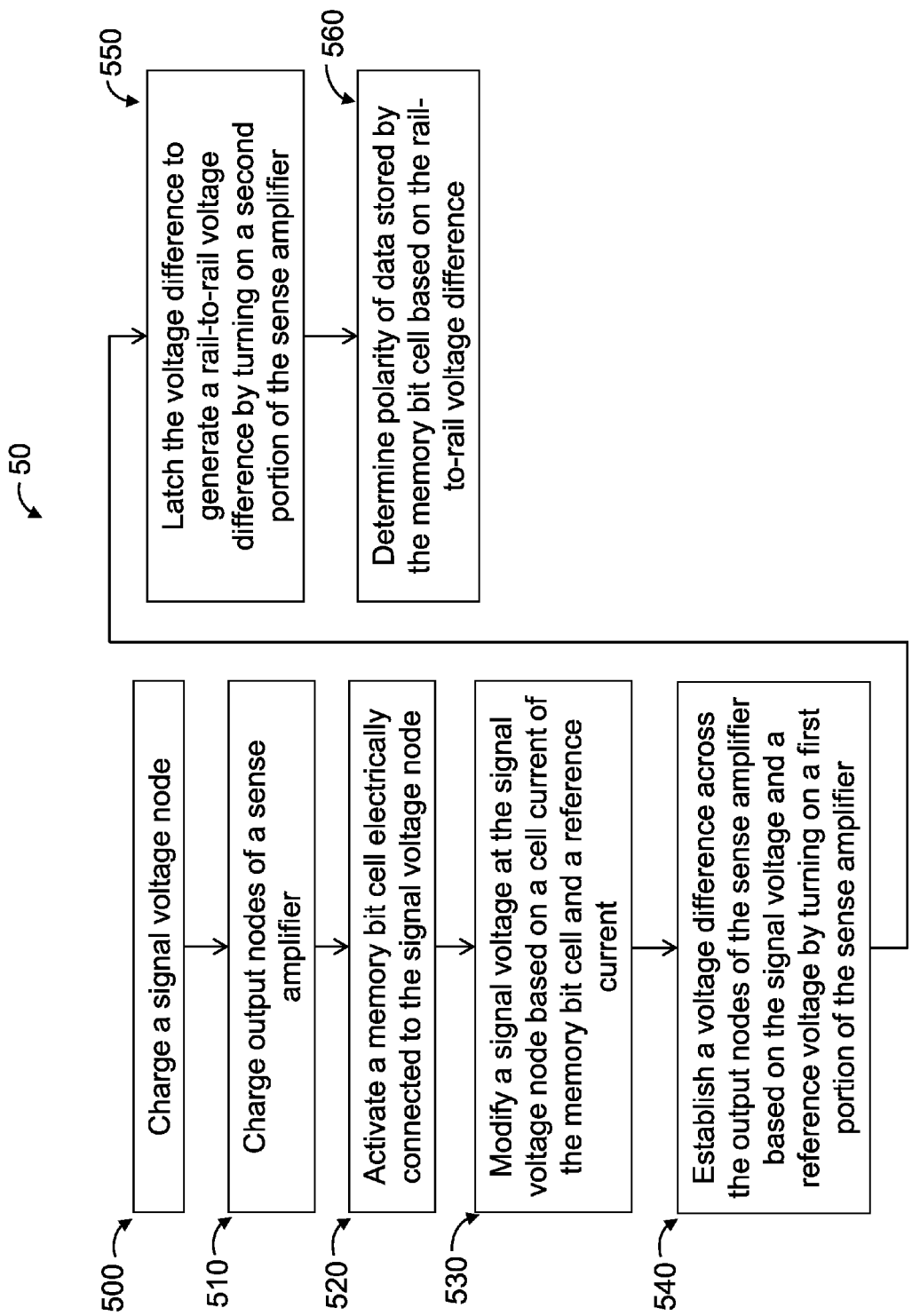
FIG. 5 is a flowchart of a method in accordance with various embodiments of the present disclosure.
Figure 6:
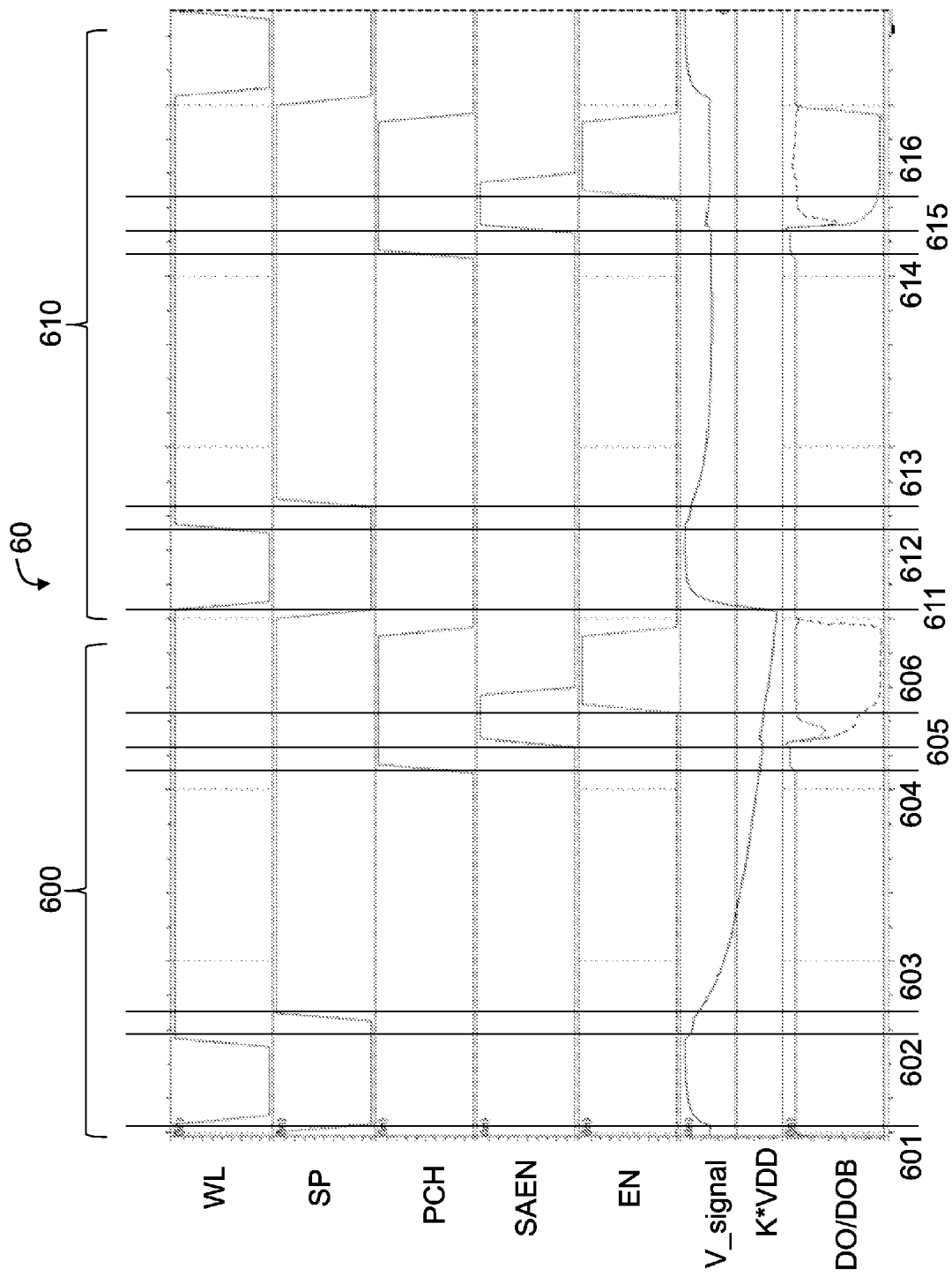
FIG. 6 is a diagram showing a timing of signals of the memory circuit of FIG. 4 in accordance with various embodiments of the present disclosure.

FIG. 5 is a flowchart of a method 50 in accordance with various embodiments of the present disclosure. FIG. 6 is a diagram showing a timing of signals of the memory circuit 40 of FIG. 4 in accordance with various embodiments of the present disclosure. In some embodiments, the method 50 is performed by the memory circuit 40 of FIG. 4. Description of the method 50 with reference to the memory circuit 40 does not exclude the method 50 from being performed using other memory circuit architectures.

FIG. 6 includes waveforms corresponding to a first read cycle 600 and a second read cycle 610. The memory bit cell 300 considered to be in a set state (corresponding to, e.g., binary "1") for the first read cycle 600, and in a reset state (corresponding to, e.g., binary "0") for the second read cycle 610. From time 601 to time 602, the precharge signal SP and the sense amplifier precharge signal PCH are asserted (e.g., low voltage), and the word line signal WL, the sense amplifier enable signal SAEN, and the enable signal EN are not asserted (e.g., high voltage). Thus, the transistors 303, 330, and 431-433 are on, and the transistors 401, 411, 420 and 301 are off. The signal voltage V_signal at the node 31 is charged by currents of the transistor 303 and the transistor 330 (operation 500). Output node voltages DO and DOB of the sense amplifier 340 (at nodes 41 and 42, hereinafter also referred to as "output node 41" and "output node 42") are charged to the first voltage VDD by operation of transistors 431-433 (operation 510).

At about the time 602, the word line signal WL is asserted, and at about the time 603, the precharge signal SP is deasserted. The transistor 330 is off to stop charging the node 31, and the memory bit cell 300 is activated (operation 520). From about the time 603 to about the time 604, the signal voltage V_signal at the node 31 is modified (e.g., pulled down) based on relative strength of cell current generated by the memory bit cell 300 and reference current generated by the transistor 303 (operation 530). Shown in FIG. 6, the signal voltage V_signal crosses the reference voltage K*VDD between the time 603 and the time 604. The cell current in the set state is typically stronger than the reference current, and is able to discharge the signal voltage V_signal to a level lower than the reference voltage K*VDD prior to capture by the sense amplifier 340.

Prior to applying the signal voltage V_signal and the reference voltage K*VDD to the sense amplifier 340, the sense amplifier precharge signal PCH is deasserted (time 604) to cease charging of the output nodes 41, 42 of the sense amplifier 340. At time 605, the sense amplifier enable signal SAEN is asserted, and the transistors 401, 411 of the sense amplifier 340 turn on. The signal voltage V_signal biases the transistor 350 to discharge the node 41 through the transistor 401. The reference voltage K*VDD biases the transistor 360 to discharge the node 42 through the transistor 411. From the time 605 to the time 606, a voltage difference is established across the nodes 41, 42 of the sense amplifier 340 (operation 540). The voltage difference is based on the signal voltage V_signal and the reference voltage K*VDD. As the nodes 41, 42 are discharged by a first current conducted by the transistors 350, 401 and a second current conducted by the transistors 360, 411, the transistors 402, 412 turn on and assist in widening the voltage difference. For example, when the signal voltage V_signal is lower than the reference voltage K*VDD (e.g., FIG. 6, time 605), voltage at the node 42 is discharged more rapidly than voltage at the node 41. The lower voltage at the node 42 causes the transistor 402 to turn on more strongly than the transistor 412. The transistor 402 pulls up the voltage at the node 41 more strongly than the transistor 412 pulls up the voltage at the node 42. Such cross-coupling of the gate electrodes of the transistors 402, 412 speeds up the establishment of the voltage difference across the output nodes 41, 42 of the sense amplifier 340.

With the enable signal EN not asserted prior to time 606, the transistors 403, 413 are turned off. When the enable signal EN is asserted around the time 606, the transistors 403, 413 are turned on, and the voltage difference established in operation 540 is latched to generate a rail-to-rail voltage difference (operation 550). As used herein, the term rail-to-rail means the difference between the two voltage "rails," such as the difference between VDD and ground. Those skilled in the art will recognize that in a real world circuit, rail-to-rail voltage will likely be slightly less than the mathematical difference between VDD and ground, arising from innate circuit characteristics, such as the resistance of conductors, the slight voltage drop across nominally on transistors (on state resistance), and the like. As used herein, rail-to-rail voltage difference is intended to encompass circuits having such less-than-ideal characteristics. For example, when the voltage at the node 41 is higher than the voltage at the node 42, the transistor 413 is turned on more strongly than the transistor 403, which pulls the voltage at the node 42 down even further. The dropping voltage at the node 42 increases source-gate voltage (Vsg) of the transistor 402, which serves to pull up the voltage at the node 41 more rapidly through charging by the transistor 402. The substantially rail-to-rail voltage difference is used to determine polarity of data stored by the memory bit cell 300 (operation 560). For example, the higher voltage at the node 41 than at the node 42 indicates that the signal voltage V_signal is lower than the reference voltage K*VDD, which indicates that the cell current is stronger than the reference current, meaning the memory bit cell 300 is set (e.g., binary "1").

The second read cycle 610 is similar to the first read cycle 600 in many respects. Operations at times 611-616 are substantially the same as at the times 601-606, respectively. In the second read cycle 610, the memory bit cell 300 is in the reset state. As a result, between the times 612 and 614, the signal voltage V_signal levels off, and does not cross the reference voltage K*VDD. Thus, when the sense amplifier precharge signal PCH is not asserted, and the sense amplifier enable signal SAEN is asserted (e.g., at the time 614), the higher voltage (the signal voltage V_signal) biasing the transistor 350 causes more rapid discharging of the node 41 than discharging of the node 42 caused by the lower voltage (the reference voltage K*VDD) biasing the transistor 360. When the enable signal EN is asserted, the positive feedback mechanism of the sense amplifier 340 described above pulls up the voltage at the node 42, and pulls down the voltage at the node 41.

In the above description, embodiments are described in which the signal voltage V_signal is charged to substantially the first voltage VDD, then discharged by the memory bit cell 300 prior to enabling the sense amplifier 340 by the sense amplifier enable signal SAEN. Other embodiments in which the signal voltage V_signal is initially discharged to a second voltage (e.g., VSS, ground, or the like), then charged by a mirrored copy of the memory bit cell 300 cell current prior to enabling the sense amplifier 340 are also contemplated herein.

Embodiments may achieve advantages. The memory circuits 20, 30, 40 exhibit very uniform performance over various process corners (e.g., SS, TT, FF, etc.). The transistor 330 allows for rapid charging of the node 31 to substantially the first voltage VDD. Applying the signal voltage V_signal and the reference voltage to the gate electrode of the transistors 350, 360 allows for buffering from operation of the sense amplifier 340. The cross-coupled inverter configuration of the sense amplifier 340 also allows for high speed operation. Disabling the transistors 403, 413 allows the voltages at the nodes 41, 42 to diverge sufficiently to allow rapid rail-to-rail latching when the transistors 403, 413 are turned on.

In accordance with various embodiments of the present disclosure, a device includes a reference current source, a current mirror electrically connected to the reference current source and a memory bit cell, and a charging device electrically connected to the current mirror, the memory bit cell, and a first voltage supply node. A first common source amplifier is electrically connected to the current mirror and the memory bit cell, a second common source amplifier is electrically connected to the first transistor, and a sense amplifier is electrically connected to the second transistor. A third transistor is electrically connected to the sense amplifier and a second voltage supply node.

In accordance with various embodiments of the present disclosure, a device comprises a reference current source, a current mirror, a charging device, a first common source amplifier, a second common source amplifier, and a sense amplifier. The current mirror is electrically connected to the reference current source and a memory bit cell. The charging device is electrically connected to the current mirror, the memory bit cell, and a first voltage supply node. The first common source amplifier is electrically connected to the current mirror and the memory bit cell. The second common source amplifier is electrically connected to a second voltage supply node. The sense amplifier is electrically connected to the first and second common source amplifiers.

In accordance with various embodiments of the present disclosure, a method includes: (a) charging a signal voltage node; (b) charging output nodes of a sense amplifier; (c) activating a memory bit cell electrically connected to the signal voltage node; (d) modifying a signal voltage at the signal voltage node based on a cell current of the memory bit cell and a reference current; (e) establishing a voltage difference across the output nodes of the sense amplifier based on the signal voltage and a reference voltage; (f) latching the voltage difference to generate a substantially rail-to-rail voltage difference; and (g) determining polarity of data stored by the memory bit cell based on the rail-to-rail voltage difference.

As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising". Moreover, the term "between" as used in this application is generally inclusive (e.g., "between A and B" includes inner edges of A and B).

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a reference current source;
   a current mirror electrically connected to the reference current source and a memory bit cell;
   a charging device electrically connected to the current mirror and the memory bit cell, and a first voltage supply node;
   a first common source amplifier electrically connected to the current mirror and the memory bit cell;
   a second common source amplifier electrically connected to a second voltage supply node; and
   a sense amplifier electrically connected to the first and second common source amplifiers.

2. The device of claim 1, wherein the sense amplifier comprises:
   a first inverter;
   a second inverter cross-coupled with the first inverter; and
   a precharging circuit having a first terminal electrically connected to an output terminal of the first inverter, and a second terminal electrically connected to an output terminal of the second inverter.

3. The device of claim 2, wherein the precharging circuit comprises:
   a first transistor having:
      a first terminal electrically connected to the output terminal of the first inverter; and
      a second terminal electrically connected to the output terminal of the second inverter;
   a second transistor having:
      a first terminal electrically connected to the first voltage supply node; and
      a second terminal electrically connected to the output terminal of the first inverter;
   a third transistor having:
      a first terminal electrically connected to the first voltage supply node;
      a second terminal electrically connected to the output terminal of the second inverter; and
      a control terminal electrically connected to control terminals of the first and second transistors.

4. The device of claim 1, further comprising:
   a clamping device electrically connected to the memory bit cell and the current mirror.

5. The device of claim 4, further comprising:
   a select transistor electrically connected to the clamping device and the memory bit cell.

6. The device of claim 5, wherein:
   the clamping device is an N-type transistor; and
   the select transistor is an N-type transistor.

7. A device comprising:
   a memory bit cell;
   a first current source;
   a current comparator electrically connected to the memory bit cell and the first current source;
   a first transistor having:
      a first terminal electrically connected to a first voltage supply node;
      a control terminal electrically connected to a controller; and
      a second terminal electrically connected to the memory bit cell and the current comparator; and
   a sense amplifier electrically connected to the current comparator, and a reference current generator.

8. The device of claim 7, wherein the first current source has a reference current source and a current mirror.

9. The device of claim 7, wherein the current comparator is an N-type transistor having a control terminal electrically connected to the memory bit cell and the first current source.

10. The device of claim 7, wherein the sense amplifier comprises:
    a first inverter;
    a second inverter cross-coupled with the first inverter; and
    a precharging circuit having a first terminal electrically connected to an output terminal of the first inverter, and a second terminal electrically connected to an output terminal of the second inverter.

11. The device of claim 7, wherein the memory bit cell is a resistive random access memory (RRAM) bit cell, a magnetoresistive random-access memory (MRAM) bit cell, a phase-change random-access memory (PCRAM) bit cell, or a conductive-bridging random-access memory (CBRAM) bit cell.

12. The device of claim 11, further comprising a clamping device electrically connected to the memory bit cell and the first current source.

13. The device of claim 7, wherein the first transistor is a P-type metal-oxide-semiconductor (PMOS) transistor.

14. A method comprising:
    (a) charging a signal voltage node;
    (b) charging output nodes of a sense amplifier; wherein the output nodes are different than the signal voltage node;
    (c) after charging output nodes, activating a memory bit cell electrically connected to the signal voltage node;
    (d) after activating the memory bit cell, modifying a signal voltage at the signal voltage node based on a cell current of the memory bit cell and a reference current;
    (e) establishing a voltage difference across the output nodes of the sense amplifier based on the signal voltage and a reference voltage;
    (f) latching the voltage difference to generate a rail-to-rail voltage difference; and
    (g) determining polarity of data stored by the memory bit cell based on the rail-to-rail voltage difference.

15. The method of claim 14, wherein (a) includes:
    charging the signal voltage node by a first transistor.

16. The method of claim 15, wherein (d) includes:
    turning off the first transistor;
    charging the signal voltage node by the reference current; and
    discharging the signal voltage node by the cell current.

17. The method of claim 14, wherein (b) includes:
    charging the output nodes of the sense amplifier to a first voltage by a precharging circuit of the sense amplifier.

18. The method of claim 17, wherein (e) includes:
    discharging one of the output nodes by a first current generated based on the signal voltage; and
    discharging the other of the output nodes by a second current generated based on the reference voltage.

19. The method of claim 14, wherein (f) includes turning on a current source electrically connected to the sense amplifier.

20. The method of claim 14, wherein (d) includes:
generating a current by a current source; and
mirroring the current to generate the reference current.

* * * * *